United States Patent [19]
van Rumpt et al.

[11] Patent Number: 4,638,263
[45] Date of Patent: Jan. 20, 1987

[54] VOLTAGE CONTROLLED OSCILLATOR INCLUDING TWO VARIABLE GAIN FEEDBACK CIRCUITS

[75] Inventors: Herman W. van Rumpt, Eindhoven, Netherlands; Charles J. H. Razzell, Cambridge, England

[73] Assignee: U.S. Philips Corporation, New York, N.Y.

[21] Appl. No.: 658,833

[22] Filed: Oct. 9, 1984

[30] Foreign Application Priority Data

Oct. 7, 1983 [GB] United Kingdom ............... 8326822

[51] Int. Cl.⁴ ..................... H03B 5/12; H03B 5/36
[52] U.S. Cl. ..................... 331/116 R; 331/117 R; 331/135; 331/177 R
[58] Field of Search ........ 331/117 R, 117 FE, 116 R, 331/116 FE, 177 R, 108 B, 135, 159, 168

[56] References Cited
U.S. PATENT DOCUMENTS 2,492,185 12/1949 Royden ........................ 332/26
3,763,439 10/1973 Peil ........................ 331/117 R X

FOREIGN PATENT DOCUMENTS 1562371 3/1980 United Kingdom .

Primary Examiner—Siegfried H. Grimm
Attorney, Agent, or Firm—Thomas A. Briody; Jack Oisher; William J. Streeter

[57] ABSTRACT

A voltage controlled oscillator having an electrical means of frequency control which is able to operate from a supply voltage which is lower than is desirable to use with a "VARICAP" diode. The oscillator comprises a pair of transistors whose base and collector electrodes are connected together, the base electrodes being connected to a supply rail and the collector electrodes are connected to a tunable parallel LC resonant circuit. A frequency determining device, e.g. a crystal, is connected between a tapping of the resonant circuit and the emitter of one of the transistors to form a first feedback path. The crystal together with an integratable small value capacitor connected between the emitters of the two transistors form a second feedback path. The phase shifts due to the first and second feedback paths are summed vectorially at the collectors of the two transistors. By varying the gain of each of the two transistors then the resultant phase shift, and thereby the frequency of oscillation, are varied.

10 Claims, 4 Drawing Figures

VOLTAGE CONTROLLED OSCILLATOR INCLUDING TWO VARIABLE GAIN FEEDBACK CIRCUITS

The present invention relates to a voltage controlled oscillator comprising two active elements having respective feedback paths with each path having a different phase shift, the phase shift in one of said two paths being substantially constant, signal outputs of the two feedback paths being summed vectorially.

A voltage controlled oscillator having two feedback paths is known from British Patent Specification No. 1562371. This known oscillator comprises a first differential amplifier comprising emitter coupled first and second transistors. The collector electrode of the first transistor is coupled via a first phase lag circuit to a regenerative voltage feedback path including a series arrangement of an emitter follower transistor, a piezoelectric crystal and a d.c. blocking capacitor, which arrangement is connected to the base electrode of the second transistor. The feedback path including the first phase lag circuit has a substantially constant phase shift. Another variable phase shift feedback path is formed by connecting the collector electrode of the second transistor to the commoned emitter electrodes of a second differential amplifier formed by third and fourth transistors, via a second phase lag circuit. A source of frequency control voltage is connected to the base electrodes of the third and fourth transistors. The collector of the third transistor is connected to the emitter follower transistor. In operation the emitter current supplied to the emitter electrodes of the third and fourth transistors is the phase shifted collector current of the second transistor, which current is split between the third and fourth transistors in response to the frequency control voltage. By varying the gain of the third transistor a variable phase shift component is added to the fixed phase shift component applied to the emitter follower transistor. Frequency control by varying the gain of one of the feedback paths, that is the one including the third transistor only, has the disadvantage that the frequency control range of the oscillator is limited and also the amplitude will vary considerably in response to the frequency control signal which is undesirable when connecting the oscillator to other circuitry. Furthermore the known oscillator circuit consumes a fairly high current especially in connection with the emitter follower transistor which is a disadvantage if the circuit is used in a battery powered receiver. Also by employing phase lag circuits which will suppress overtone frequencies the known oscillator operates around the fundamental crystal frequency which limits the useful frequency range of the oscillator circuit.

Another known method of controlling the frequency of an oscillator is to use a VARICAP diode. While such a frequency control technique is used widely it does have some disadvantages. VARICAP diodes are relatively expensive and are preferably operated at high voltages to obtain an acceptable linearity. Further as VARICAP diodes are fairly large physically then when integrating these into a monolithic circuit element a relatively large area has to be provided.

SUMMARY OF INVENTION

It is an object of the present invention to apply frequency control to a voltage controlled oscillator which avoids the disadvantages of the known techniques described above.

According to the present invention there is provided a voltage controlled oscillator comprising two active elements having respective feedback paths with each path having a different phase shift, the phase shift in one of said two paths being substantially constant, signal outputs of the two feedback paths being summed vectorially, characterised in that means are provided for varying the gain distribution between the two feedback paths, said gain varying means comprising two control devices respectively coupled to the two active elements, and means for applying a frequency control voltage to each of the control devices to vary the distribution of the current through their associated active elements to alter the gain in each path and thereby change the total phase shift and hence the frequency of the oscillator.

By varying the gain in both feedback paths a larger frequency control range is obtainable compared to controlling the gain in one feedback path and also the variation in amplitude in response to frequency control voltages is less. In implementing the oscillator circuit made in accordance with the present invention current feedback is used which leads to an overall reduction in current consumption compared with having voltage feedback.

Furthermore by coupling a tunable phase lead circuit to the combined output of the active elements then the oscillator can operate on the overtone mode frequencies of the frequency determining device, for example a piezo electric crystal, as well as in the fundamental mode which increase the applicability of the oscillator circuit.

The present invention also provides a voltage controlled oscillator characterised by two active elements having respective outputs, the signal outputs of which are summed vectorially, a frequency determining device coupled between the output summing point and an input of one of the active elements, a phase shifting element coupled between the inputs of the two active elements, and control devices respectively coupled to the active elements for controlling the gain of each of the two active elements and thereby the phase shift in feedback paths including the active elements.

The present invention further provides a voltage controlled oscillator characterised by a semiconductor device having a collector, a base and first and second emitter junctions, a tunable resonant circuit coupled to the collector and a frequency determining device coupled between the resonant circuit and a first emitter junction, a capacitance coupled between first and second emitter junctions, a differentially connected pair of transistors having collectors coupled respectively to the first and second emitter junctions, means for varying the conductivity of the transistors of the differentially connected pair to vary thereby the conductivity of the transistors formed by the first emitter junction, the base and the collector and by the second emitter junction, the base and the collector and in so doing changing the total phase shift at the collector of the semi-conductor device.

The oscillator made in accordance with the present invention comprises an electrical means of frequency control of the oscillator which does not require the use of a "VARICAP" diode and in consequence can be more readily integrated into a smaller area. Furthermore when the oscillator is used in low voltage equipment such as battery powered paging receivers one is able to obtain a more linear voltage to frequency curve than is possible from the simple use of "VARICAP" diodes which per se are not linear devices. Consequently frequency modulation and demodulation are possible with the oscillator made in accordance with the present invention.

The present invention will now be explained and described, by way of example, with reference to the accompanying drawings, wherein:

DESCRIPTION OF THE PREFERRED EMBODIMENT

Figure 1:
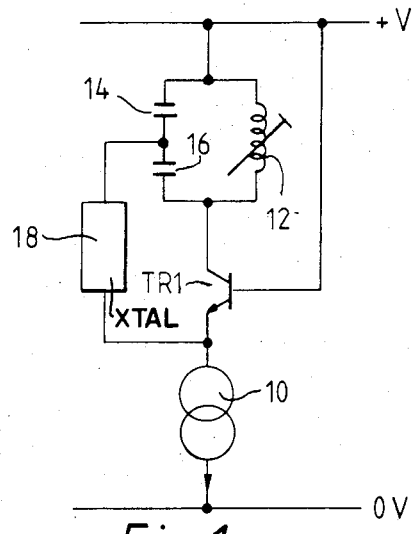
FIG. 1 is a schematic circuit diagram of a Colpitt's oscillator.

Referring to the Colpitt's oscillator circuit shown in FIG. 1 it comprises a NPN transistor TR1 whose base electrode is connected to the positive voltage supply rail + Vcc. Its emitter is connected via a current source 10 to a low voltage rail which in the illustrated embodiment is at 0 volts. A resonant circuit comprising a variable inductance 12 which is in parallel with two series connected capacitors 14, 16 is connected between the collector and the positive voltage supply rail + Vcc. An impedance 18 is connected between the emitter of the transistor TR1 and the junction of the capacitors 14, 16 of the resonant circuit. The impedance 18 must be small otherwise the resultant attenuation will not allow the loop gain of the circuit to exceed unity.

Figure 2:
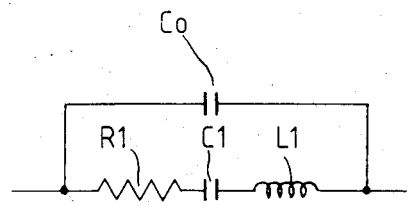
FIG. 2 shows the equivalent electrical circuit of a crystal which can be used in place of the impedance in the oscillator shown in FIG. 1.

This circuit is well known and need not be described in detail. However, in order for the circuit to function as an oscillator it is necessary for the loop gain of the oscillator to be greater than unity while the total phase shift around the same loop is zero or a multiple of 360°. Now if the impedance 18 is zero then the oscillator will resonate at a frequency determined by the resonant circuit connected to the collector of the transistor TR1. However, if the impedance 18 is replaced by a crystal having, at around the wanted oscillation frequency, an electrical equivalent circuit of the type shown in FIG. 2, the impedance of the crystal will only be low enough to allow oscillation at the desired series resonant mode of the crystal. If the resonant circuit of the oscillator is tuned to be the same as the series resonant frequency of the wanted mode of crystal resonance then the frequency f1 of oscillation is:

$$f1 = \frac{1}{2\pi\sqrt{L1 \cdot C1}}$$

where L1 and C1 are the series resonant components of the crystal in the wanted mode and ignoring the effects of the parasitic capacitance Co.

If a small capacitor of capacitance Ce is placed in series with the crystal in the oscillator loop, then if the circuit is oscillating, the phase shift around the loop must again be zero. However, the voltage phase shift between the emitter of the oscillator and the tapping point of the resonant circuit in the collector of the transistor TR1 has not been significantly changed by the addition of the extra series capacitance. This means that the new frequency of oscillation is determined by the effect of the additional capacitance Ce being in series with the resonant circuit of the crystal and in consequence a new frequency f2 is:

$$f2 = \frac{1}{2\pi\sqrt{L1 \cdot C1 \cdot Ce/(C1 + Ce)}}$$

from these two equations it can be shown that the available shift in frequency $\Delta f = f1 \cdot (\sqrt{(1+C1/Ce)} - 1))$, ignoring the effects of the parasitic capacitance Co and that this approximates to $\Delta f = f1 \cdot C1/(2 \cdot Ce)$.

In the case of a third overtone crystal with an equivalent circuit at 50 MHz of $1.38 \times 10^{-3}$ pF (in series with an inductance of 7.34 mH) a frequency shift of 3.45 kHz could be obtained by the insertion of 10 pF in series with the crystal.

Figure 3:
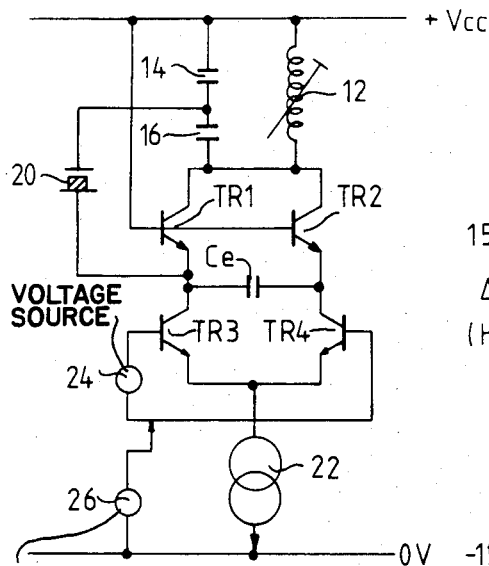
FIG. 3 is a schematic circuit diagram of a voltage controlled crystal oscillator made in accordance with the present invention.

The oscillator circuit shown in FIG. 3 enables a series capacitance to be electronically switched in and out of the circuit in a gradual manner thereby changing the total phase shift. The circuit comprises two oscillator transistors TR1 and TR2 whose base electrodes are connected together and are connected to the positive voltage supply line + Vcc. The collectors of the transistors TR1, TR2 are conected together and are coupled to a resonant circuit comprising an inductance 12 which is connected in parallel with two series connected capacitors 14 and 16. A crystal 20 is connected in the feedback path between the junction of the capacitors 14, 16 and the emitter of the transistor TR1. A series capacitor Ce having a value of for example 10 pF is connected between the emitters of the transistors TR1 and TR2 and in consequence the crystal 20 and the capacitor Ce may be considered as the feedback path of the transistor TR2. If desired the transistors TR1 and TR2 may be replaced by a single transistor with two emitter diffusions when implementing the circuit on a monolithic semiconductor device. The circuit described so far may be regarded as two active elements having respective feedback paths applying different phase shifts, but each path has a common element constituted by the crystal 20. At the collectors of the transistors TR1 and TR2 the outputs therefrom are summed vectorially. Varying the gains of the transistors TR1 and TR2 varies the total gain applied by each path and thereby the resultant phase shift.

In order to vary the gains of the transistors TR1 and TR2 their emitters are connected respectively to the collectors of differentially connected transistors TR3 and TR4 whose emitters are coupled together and are connected to a current source 22 which is connected to the lower voltage supply rail which in the present embodiment is zero volts. An automatic frequency control voltage, represented in FIG. 3 as a voltage source 24, is connected between the base electrodes of the transistors TR3 and TR4. A voltage reference source 26 is coupled between the base electrodes of the transistors TR3 and TR4 and the lower voltage supply line.

In operation the differently connected transistors TR3 and TR4 determine the distribution of current between the two oscillator transistors TR1, TR2. The control of this current distribution is effected by the application of a differential voltage to the base electrodes of the transistors TR3 and TR4 which differential voltage is supplied by the source 24. It can be seen when a large differential voltage is applied to these bases then one transistor of the differential pair will be fully switched on and the other fully off. In such a situation only one of the two oscillator transistors TR1, TR2 is actively contributing to the oscillator function. If one considers the two extreme cases when the differential pair of transistors TR3, TR4 is switched in one direction, the oscillator transistor TR1 is fully on and the feedback of the oscillator includes the crystal 20 only and the frequency, f1, is determined by the phase shift due to the crystal 20 alone. When the differential pair of transistors TR3, TR4 is switched the other way, TR2 is fully on and the oscillator feedback path includes both the crystal 20 and the 10 pF series capacitor Ce and the frequency f2 is determined by the phase shift due to these components being in series. Thus by the mechanism described, the frequency of oscillation will be modified by a predetermined amount.

Figure 4:
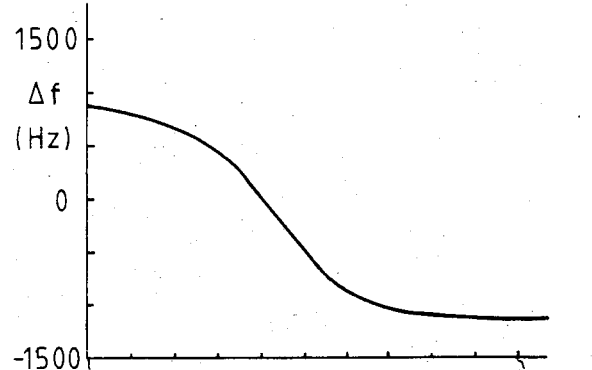
FIG. 4 is a frequency/differential voltage transfer curve derived from the circuit shown in FIG. 3.

Between these two extremes of control, the frequency shift will be a smooth function of the differential voltage applied to the transistors TR3, TR4 which are both active. This in turn means that the conductivity of the transistors TR1, TR2 is varied accordingly. The pause shifts due to each of the two feedback paths and the gain of their respective transistors TR1, TR2 are summed vectorially at the collectors of the transistors TR1, TR2. The final phase angle will thus be dependent on the current distribution between the two transistors because this determines the relative magnitude of the phase shifted and non-phase shifted components. The remaining connection in the oscillator loop is formed by the crystal and therefore the final frequency of oscillation will be that at which the phase shift caused by the crystal 20 compensates the phase shift introduced by the active part of the circuit formed by the transistors TR1, TR2 and the capacitor Ce. Thus the final frequency of oscillation is determined by the current distribution between the transistors TR1, TR2 and is also a smooth continuous function of the differential voltage applied to the base of the differential pair of transistors TR3, TR4. This smooth change is illustrated in FIG. 4 wherein the abscissa is the differential control voltage E in millivolts applied to the base electrodes of the transistors TR3, TR4 and the ordinate is the frequency change Δf in hertz.

In implementing the circuit shown in FIG. 3, the transistors TR1 to TR4 comprise small signal RF transistors to suit the frequency of oscillation, for example they may comprise transistors type BFY90. The circuit may be implemented in other technologies such as MOS and gallium arsenide.

A particular application of the oscillator circuit made in accordance with the present invention is as a local oscillator in the direct modulation FM receiver disclosed in British Patent Specification No. 2109201A wherein the local oscillator frequency is offset from the carrier frequency by a predetermined amount. In order to maintain the tones received at their particular offset frequencies it is important that the oscillator is stable and by adjusting the voltage applied to the base electrodes of the transistors TR3 and TR4 then the local oscillator frequency can be maintained fairly stable thereby ensuring that the centre frequencies of the two signalling tones are sufficiently different to enable them to be distinguished from each other by means of bandpass filters.

Although the present invention has been described with reference to a crystal oscillator it is applicable to other oscillators such as an LC oscillator.

What is claimed is:

1. A voltage controlled oscillator comprising two active elements having respective feedback paths with each path having a different phase shift, the phase shift in one of said two paths being substantially constant, signal outputs of the two feedback paths being summed vectorially, and a tunable L.C. circuit for receiving said summed signal outputs, further comprising means for varying the gain distribution between the two feedback paths, said gain varying means comprising two control devices respectively coupled to the two active elements, and means for applying a frequency control voltage to each of the control devices to vary the distribution of the current through their associated connected active elements to alter the gain in each path whereby the total phase shift and frequency of the oscillator is modified.

2. An oscillator as claimed in claim 1, wherein the respective feedback paths have at least one frequency determining device which is common to both paths.

3. An oscillator as claimed in claim 1, wherein the active elements comprise junction transistors connected in a common base configuration, and a capacitance is coupled between the emitter electrodes of said transistors, and the two control devices comprise a differential amplifier whose outputs are connected respectively to said emitter electrodes.

4. A voltage controlled oscillator having two active elements, each having respective outputs, the signal from said outputs being summed vectorially, and supplied to a tuned parallel L.C. circuit which includes two serially connected capacitors, a frequency determining device coupled between the junction of said two serially connected capacitors and an input of one of the active elements, a phase shifting element coupled between the inputs of the two active elements, and control devices coupled respectively to the active elements for controlling the gain of each of the two active elements and thereby the phase shift in feedback paths including the active elements.

5. An oscillator as claimed in claim 4, wherein the active elements and the control devices comprise semiconductor devices of the same conductivity type.

6. A voltage controlled oscillator including a semiconductor device having a collector, a base, and first and second emitter junctions, a tunable resonant circuit coupled to the collector and a frequency determining device coupled between said resonant circuit and the first emitter junction, a capacitance coupled between the first and second emitter junctions, a differentially connected pair of transistors having collectors coupled respectively to the first and second emitter junctions, means for varying the conductivity of the transistors of the differentially connected pair to vary the conductivity of the transistors formed by the first emitter junction, the base and the collector and by the second emitter junction, the base and the collector and in so doing changing the total phase shift at the collector of the semiconductor device.

7. An oscillator as claimed in claim 6, wherein the semiconductor device comprises first and second junction transistors of the same conductivity type, the base electrodes of the first and second transistors being coupled together and their collector electrodes being coupled to the resonant circuit.

8. A voltage controlled oscillator comprising:
a transistor circuit having a base connection, collector connection, and first and second emitter connections;
a resonant circuit coupled at one end to said collector connection and at a second end to said base connection forming a d.c. voltage receiving terminal;
a coupling circuit for coupling a feedback current from said resonant circuit to said first emitter connection, said coupling circuit including a resonant element;
a phase shift element coupling a portion of said feedback current to said second emitter connection;
a differential transistor pair having first and second collectors connected to said first and second emitter connections, and a common terminal, said differential transistor pair controlling the magnitude of differential currents produced when a d.c. voltage source is connected between said common terminal and d.c. voltage receiving terminal whereby the total phase shift of said feedback current reaching said collector connection is controlled thus controlling a frequency of oscillation of said transistor circuit.

9. The voltage controlled oscillator of claim 8 wherein said resonant element is an overtone crystal.

10. The voltage controlled oscillator of claim 8 wherein said resonant circuit comprises first and second serially connected capacitors, the junction of said connected capacitors providing said feedback current, and an inductor connected to resonate with said serially connected capacitors.

* * * * *